United States Patent
Mehdizad Taleie et al.

(10) Patent No.: US 10,666,285 B1
(45) Date of Patent: May 26, 2020

(54) DIGITAL-TO-ANALOG CONVERTER (DAC) WITH MIXING-MODE PARALLEL PATH IMAGE ATTENUATION

(71) Applicant: QUALCOMM Incorporated, San Diego, CA (US)

(72) Inventors: Shahin Mehdizad Taleie, San Diego, CA (US); Behnam Sedighi, La Jolla, CA (US); Dongwon Seo, San Diego, CA (US); Parisa Mahmoudidaryan, Tempe, AZ (US); Bhushan Shanti Asuri, San Diego, CA (US); Sang-June Park, San Diego, CA (US); Shrenik Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/202,723

(22) Filed: Nov. 28, 2018

(51) Int. Cl.
*H03M 1/66* (2006.01)
(52) U.S. Cl.
CPC .................... *H03M 1/662* (2013.01)
(58) Field of Classification Search
CPC ...................................... H03M 1/662

USPC .................................................. 341/141, 144
See application file for complete search history.

(56) References Cited

U.S. PATENT DOCUMENTS

| 7,023,371 | B2* | 4/2006 | Schoner | H03M 3/368 341/143 |
| 8,520,968 | B1* | 8/2013 | Wyville | G06K 9/0051 382/191 |
| 10,355,705 | B2* | 7/2019 | Schmidt | |

* cited by examiner

*Primary Examiner* — Khai M Nguyen
(74) *Attorney, Agent, or Firm* — Patterson + Sheridan, L.L.P.

(57) ABSTRACT

Certain aspects of the present disclosure generally relate to circuitry and techniques for digital-to-analog conversion. One example system for digital-to-analog conversion generally includes a first digital-to-analog converter (DAC) having an input coupled to an input node of the system and a mixing-mode DAC having an input coupled to an input node of the system. The mixing-mode DAC may include a second DAC and a mixer, an output of the second DAC being coupled to an input of the mixer. The system may also include a combiner, wherein an output of the first DAC is coupled to a first input of the combiner, and wherein an output of the mixer is coupled to a second input of the combiner.

19 Claims, 8 Drawing Sheets

US 10,666,285 B1

DIGITAL-TO-ANALOG CONVERTER (DAC) WITH MIXING-MODE PARALLEL PATH IMAGE ATTENUATION

TECHNICAL FIELD

Certain aspects of the present disclosure generally relate to electronic circuits and, more particularly, to circuitry for digital-to-analog conversion.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more digital-to-analog converters (DACs) for converting digital signals to analog signals.

SUMMARY

Certain aspects of the present disclosure generally relate to circuitry and techniques for digital-to-analog conversion.

Certain aspects provide a system for digital-to-analog conversion. The circuit generally includes a first digital-to-analog converter (DAC) having an input coupled to an input node of the system and a mixing-mode DAC having an input coupled to an input node of the system. The mixing-mode DAC may include a second DAC, and a mixer, an output of the second DAC being coupled to an input of the mixer. The circuit may also include a combiner, wherein an output of the first DAC is coupled to a first input of the combiner, and wherein an output of the mixer is coupled to a second input of the combiner.

Certain aspects provide a method for digital-to-analog conversion. The method generally includes generating a first analog signal by performing digital-to-analog conversion based on a digital input signal, generating a second analog signal by performing digital-to-analog conversion based on the digital input signal, frequency mixing the second analog signal to generate a frequency-mixed analog signal, and combining the first analog signal and the frequency-mixed analog signal.

Certain aspects provide an apparatus for digital-to-analog conversion. The apparatus generally includes means for generating a first analog signal by performing digital-to-analog conversion based on a digital input signal, means for generating a second analog signal by performing digital-to-analog conversion based on the digital input signal, means for frequency mixing the second analog signal to generate a frequency-mixed analog signal, and means for combining the first analog signal and the frequency-mixed analog signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
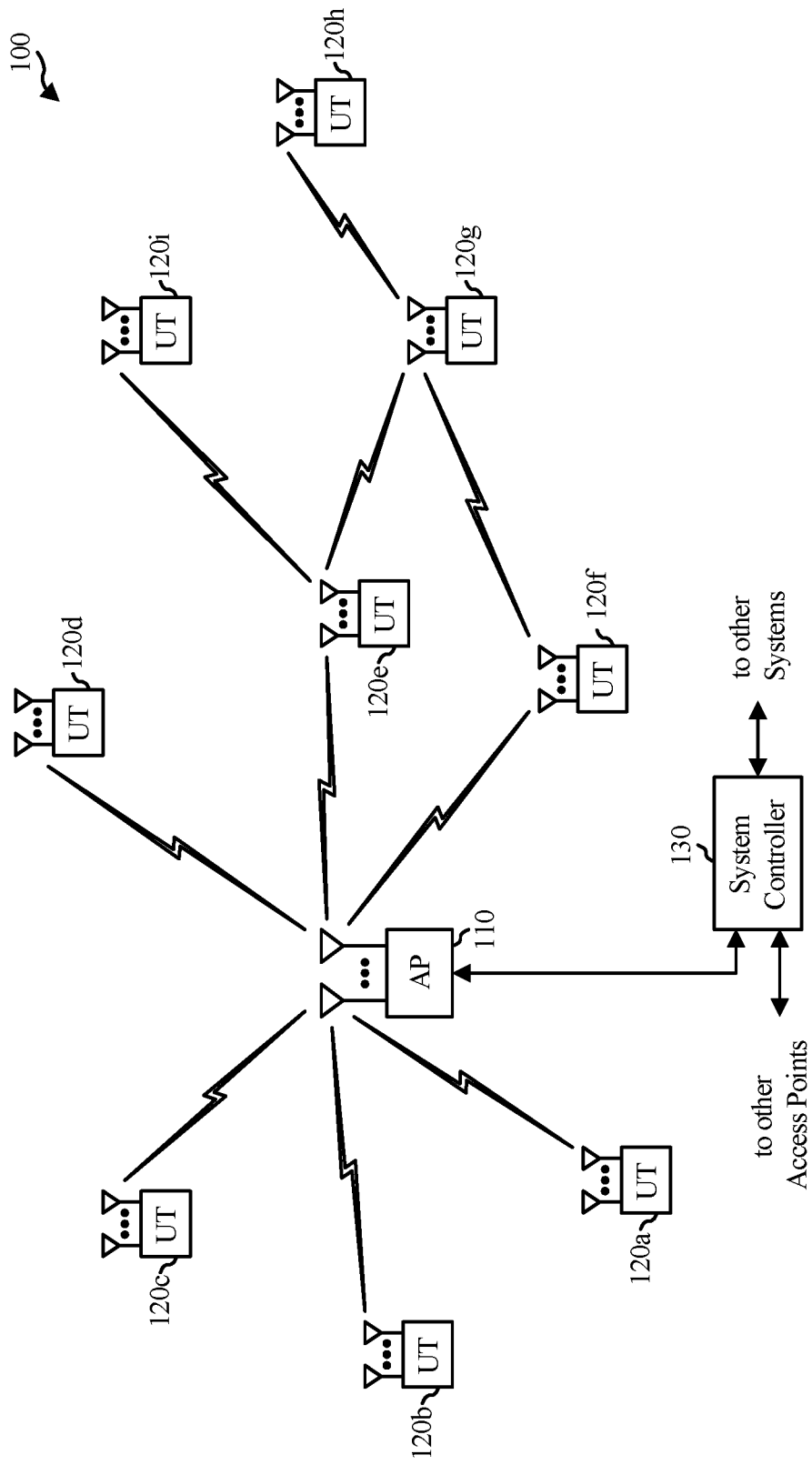
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a digital-to-analog converter (DAC) system implemented using a mixing-mode DAC, as described in more detail herein.

Figure 2:
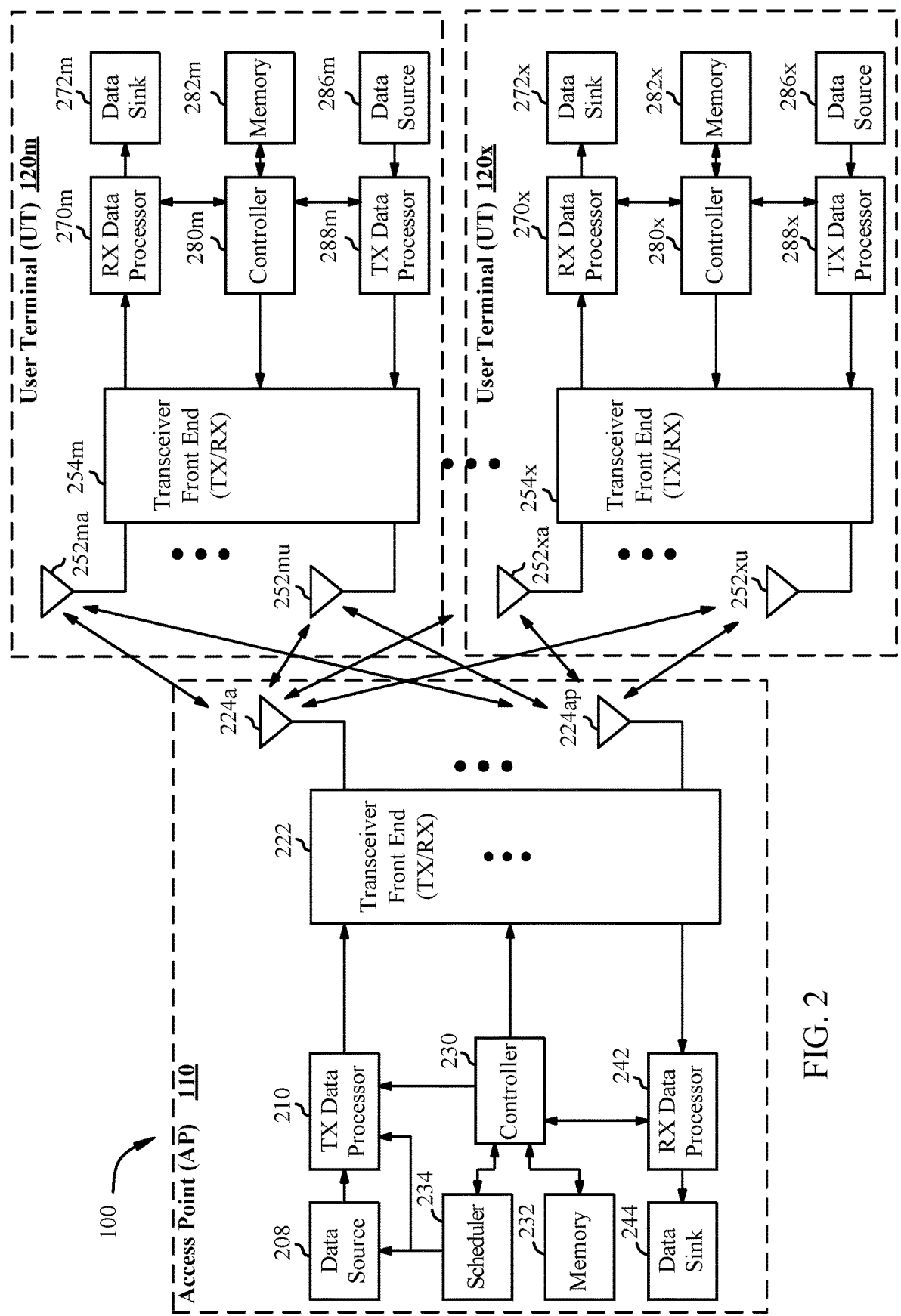
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a DAC system implemented using a mixing-mode DAC, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
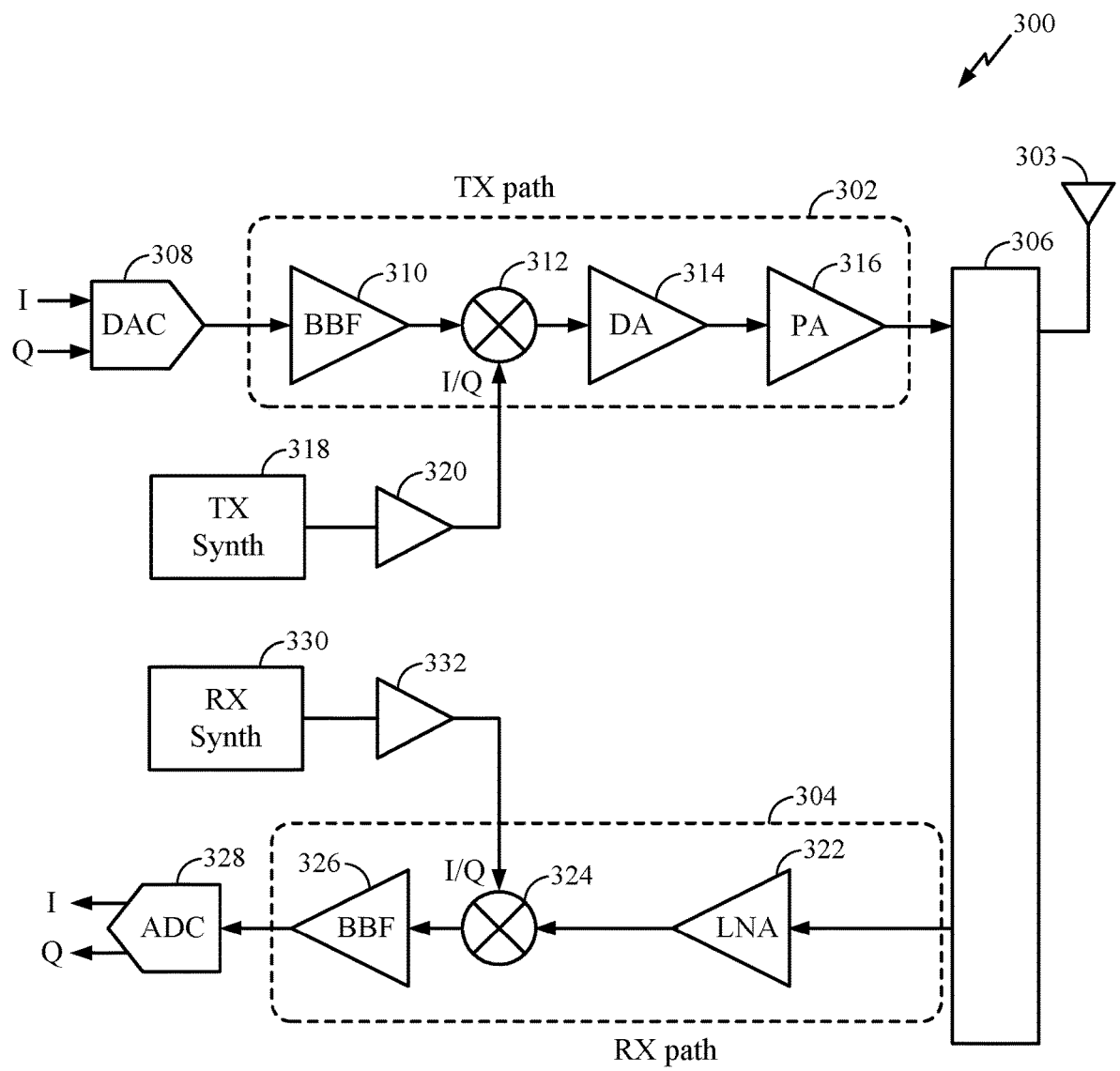
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The DAC 308 may be implemented using a mixing-mode DAC, as described in more detail herein. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for digital-to-analog conversion in any of various other suitable systems.

Example Digital-to-Analog Converter (DAC) with Mixing-Mode Parallel Path Image Attenuation The digital-to-analog converter (DAC) (e.g., DAC 308) used in wireless applications creates image signals around multiple harmonics of the sampling frequency (fs) of the DAC. In wideband wireless applications, the transmit (TX) path may be wideband to pass the wideband baseband signal with low attenuation; thus, it may be challenging to provide filtering for the image signals. Wireless communication standards may set tight limits on power emissions, and thus, it may be desirable to attenuate these image signals in an effort to reduce emitted power at out-of-band frequencies.

One way to reduce/attenuate the power of the image signals is to increase the DAC effective sampling rate by using interpolating DACs. However, this approach may result in increased DAC power consumption. In some cases, interleaving DACs may be used to cancel the image signals, which allows for achieving high speeds while using slower sub-DACs and saving power.

In order to cancel image signals at nfs, an interpolation and/or interleaving DAC may be used with effective sample rate of 2nfs, where n is a positive integer (i.e., equal to or greater than 1). Moreover, an interpolation DAC that can cancel image signals at 2nfs may be operated at a sampling rate of 4nfs. It may be challenging to meet timing requirements when operating the interpolated DAC at a sampling rate of 4nfs. The speed constraint may be relieved by the use of interleaving DACs; however, using interleaving DACs increases the silicon area and cost of the DAC. Certain aspects of the present disclosure are generally directed to a DAC and a mixing-mode DAC coupled in parallel with the DAC for image signal attenuation.

Figure 4:
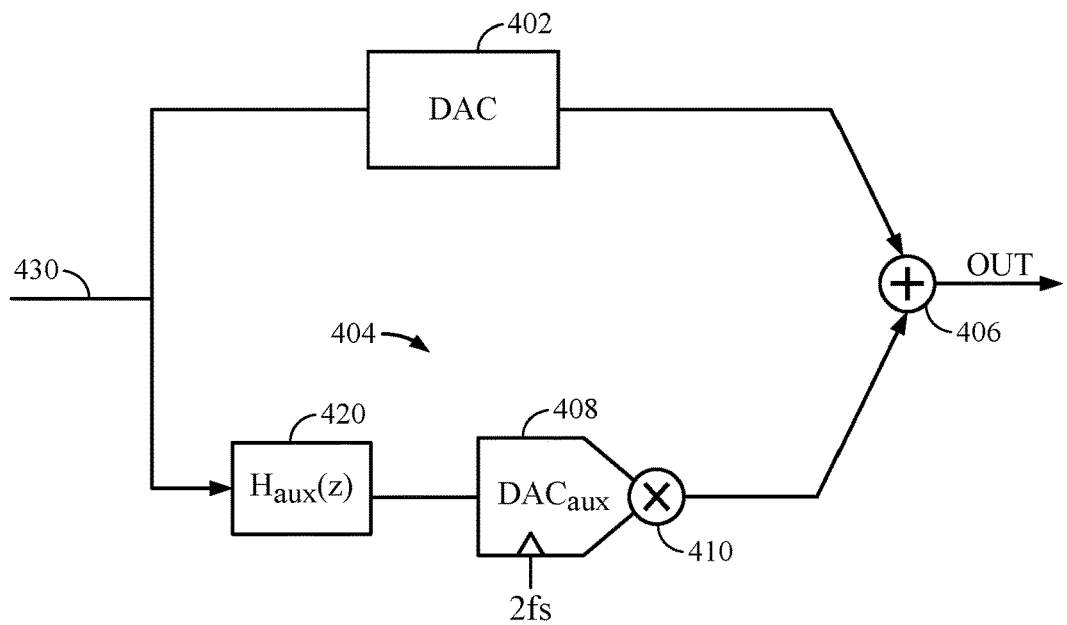
FIG. 4 illustrates a digital-to-analog conversion system, in accordance with certain aspects of the present disclosure.

FIG. 4 illustrates a digital-to-analog conversion system 400, in accordance with certain aspects of the present disclosure. The digital-to-analog conversion system 400 may correspond to the DAC 308 described with respect to FIG. 3. The digital-to-analog conversion system 400 includes a DAC 402 and an auxiliary mixing-mode DAC 404, the inputs of which are coupled to an input node 430 of the system 400, as illustrated. In certain aspects, the outputs of the DAC 402 and the auxiliary mixing-mode DAC 404 may be coupled to inputs of a combiner 406. The mixing-mode DAC 404 may include a DAC 408 having an output coupled to an input of a mixer 410, the output of the mixer 410 being coupled to an input of the combiner 406. The mixing-mode DAC has a sampling frequency of nfs, and thus, its fundamental output cancels an image signal of the DAC 402 around nfs. Signals around nfs are generated by the mixing-mode DAC 404 and subtracted from the output of the DAC 402 by the combiner 406, as described in more detail with respect to FIG. 5.

The parallel path DAC (e.g., mixing-mode DAC 404) operating at the clock rate of nfs has a built-in mixing mode upconversion (e.g., via mixer 410) that receives a replica of the input signal at the input node 430 at around nfs. The signal generated by the mixing-mode DAC 404 is subtracted from the main DAC output to attenuate the power at around nfs (e.g., if input signal at input node 430 has a frequency fin, then the image signal may be at nfs+/−fin). The mixing-mode DAC 404 has an almost flat frequency response in the range of nfs, whereas the response of the DAC 402 is shaped by a sinc function around nfs. Therefore, a digital filter (e.g., filter 420) may be implemented at the input of the mixing-mode DAC 404 to create a signal that has the same amplitude and phase as that of the image signal of the DAC 402. The mixing-mode DAC 404 may be implemented with a lower resolution than the main DAC (e.g., DAC 402). For example, in high dynamic range designs, the DAC 402 may be an N-bit DAC, and the mixing-mode DAC 404 may be an M-bit DAC where M is less than N.

Figure 5:
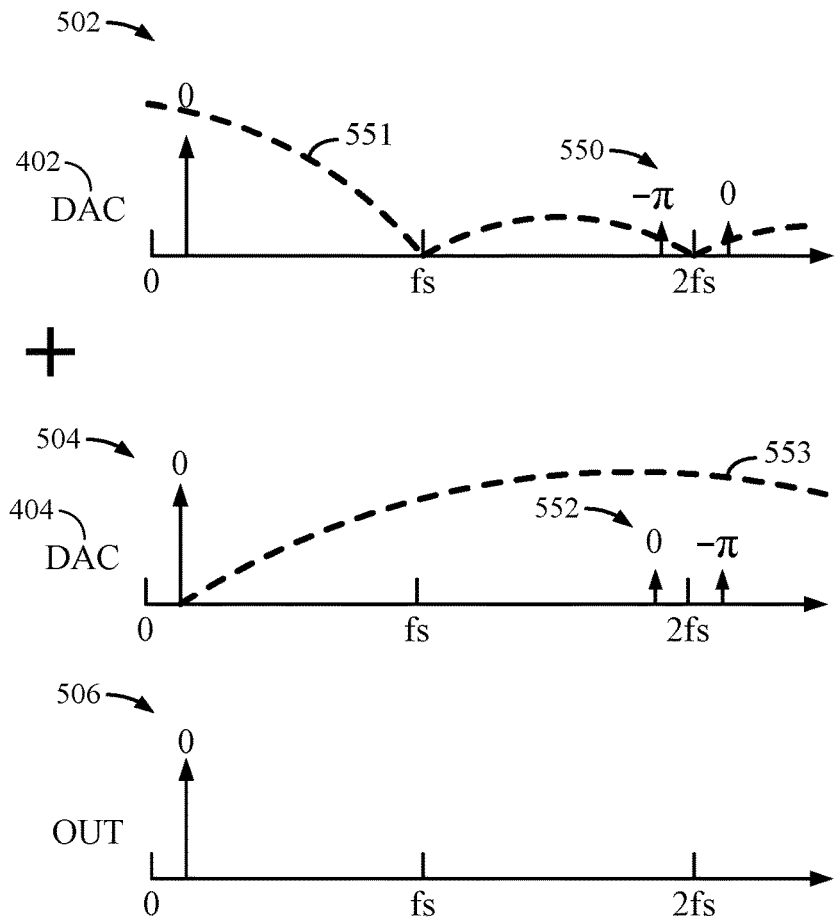
FIG. 5 illustrates graphs showing signals generated by a digital-to-analog converter (DAC), a mixing-mode DAC, and a combiner of the digital-to-analog conversion system of FIG. 4, in accordance with certain aspects of the present disclosure.

FIG. 5 illustrates graphs 502, 504, 506 showing the frequency-domain response of output signals of the DAC 402, the mixing-mode DAC 404, and the combiner 406, respectively. As illustrated, the DAC 402 generates an image signal 551 at a frequency of 2fs (e.g., as illustrated by image frequencies 550), and the mixing-mode DAC 404 generates a signal 553 at the frequency of 2fs having an opposite polarity (i.e., a phase difference of 180°, or π radians) of the image signal generated by the DAC 402 (e.g., as illustrated by image frequencies 552). Thus, as illustrated by graph 506, the signal generated at the output of the combiner 406 does not include the image signals, which are cancelled out by combining the outputs of the DAC 402 and the mixing-mode DAC 404. Since the image signal at 2fs has a relatively small magnitude, the magnitude of the signal generated by the mixing-mode DAC 404 may also be relatively small. Thus, the mixing-mode DAC 404 may be small in size, such that the digital-to-analog conversion system 400 may be implemented with a smaller footprint as compared to conventional implementations (e.g., an interleaved DAC for cancelling the image signal at the frequency of 2fs).

In certain aspects, a filter 420 may be coupled between the input node 430 and the input of the mixing-mode DAC 404, as illustrated in FIG. 4. The digital filter pre-equalizes the input of the DAC 404 and ensures that the output signal of the DAC 404 matches the image of the DAC 402 in terms of amplitude and phase for all applicable input frequencies.

Figure 6:
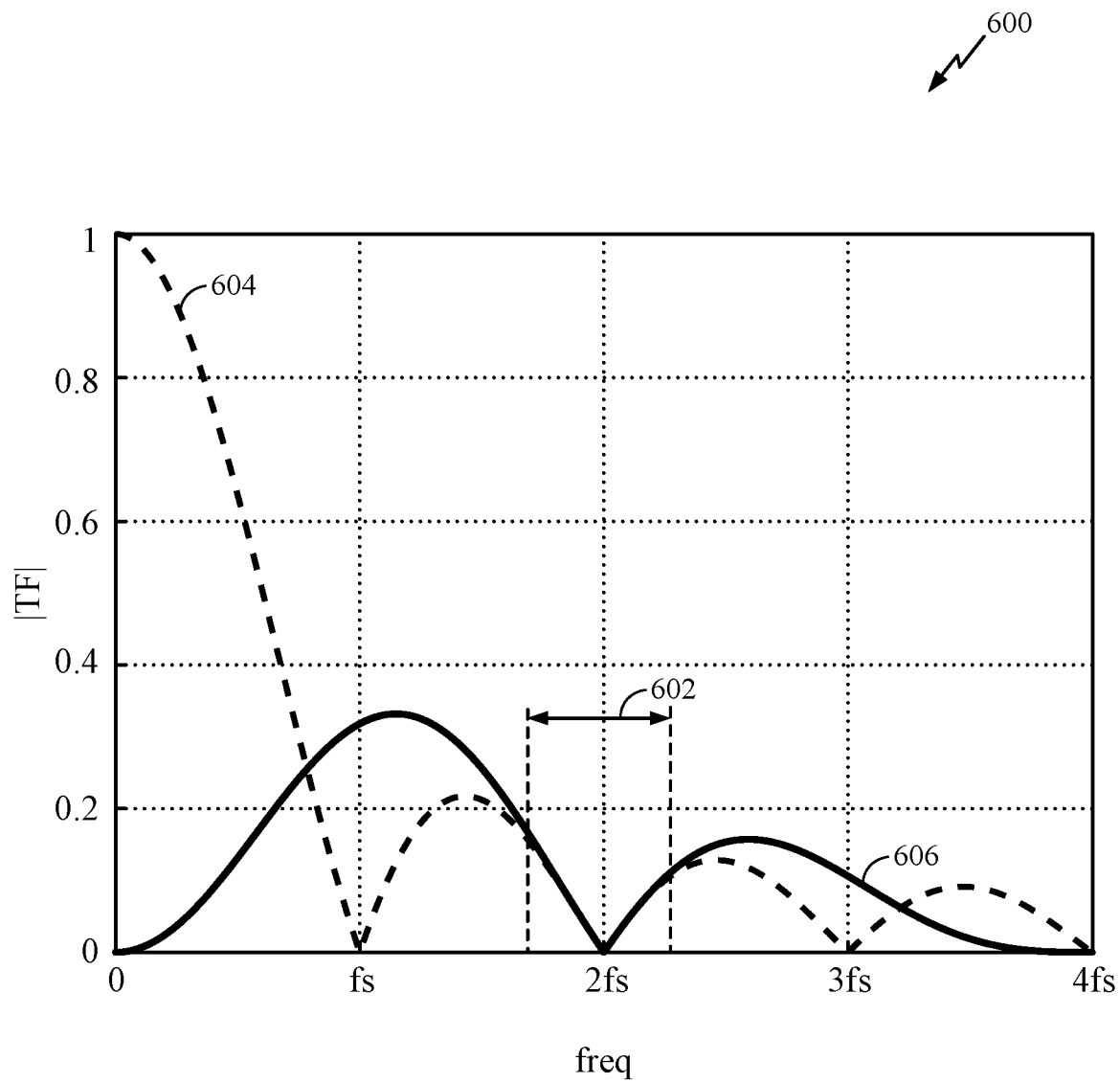
FIG. 6 is a graph illustrating normalized frequency responses of signals generated by a DAC and a mixing-mode DAC coupled to a filter, in accordance with certain aspects of the present disclosure.

FIG. 6 is a graph 600 illustrating the transfer function of the DAC 402 and the mixing-mode DAC 404 coupled to the filter 420, in the frequency domain, in accordance with certain aspects of the present disclosure. The curve 604 illustrates the normalized frequency response (e.g., transfer function (TF)) of the DAC 402, and the curve 606 illustrates the normalized frequency response of the mixing-mode DAC 404 with filter 420. As illustrated, within the band 602, the frequency response of the DAC 402 and the frequency response of the mixing-mode DAC 404 plus filter 420 are about aligned. Since the phases of the output signals generated by the DAC 402 and the mixing-mode DAC 404 plus filter 420 are opposite, the image signal generated by the DAC 402 within the band 602 is cancelled. The high-pass response of filter 420 and the auxiliary mixing-mode DAC 404 compensates for the roll of sinc response of the DAC 402.

Figure 7:
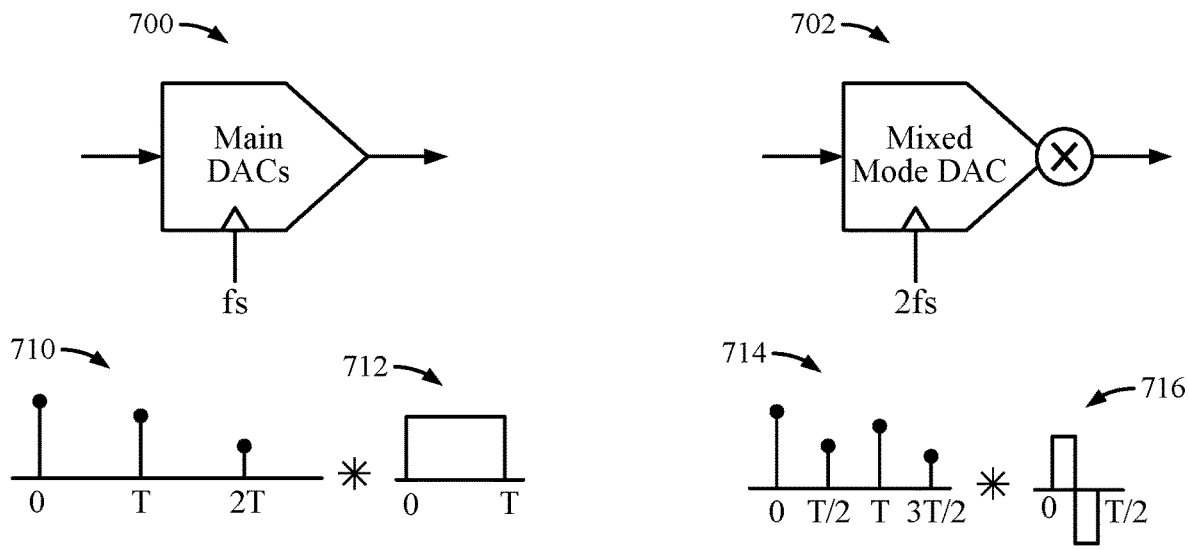
FIG. 7 illustrates an example DAC, an example mixing-mode DAC, and their respective time-domain input data streams and impulse responses, in accordance with certain aspects of the present disclosure.

FIG. 7 illustrates an example DAC 700 (e.g., corresponding to the DAC 402) and an example mixing-mode DAC 702 (e.g., corresponding to the mixing-mode DAC 404). Graph 710 depicts impulses as a discrete time representation of the digital input, illustrating a sample at every sampling interval T (=1/fs) for the DAC 700, and graph 712 illustrates an impulse response, which is effectively convolved with the discrete samples to convert the digital input to an analog signal output by the DAC 700. In certain aspects, the mixing-mode DAC 702 may have a sampling frequency of twice the sampling fs (2fs) of DAC 700 in order to cancel an image signal at the frequency 2fs, as described herein. Thus, the graph 714 portrays impulses as a discrete time representation of the digital input, illustrating a sample at every sampling interval T/2 (½fs) for the mixing-mode DAC 702, and graph 716 illustrates an impulse response of the mixing-mode DAC 702, which is effectively convolved with the discrete samples to convert the digital input to an analog signal output by the mixing-mode DAC 702. The transfer function H of the mixing-mode DAC 404 plus filter 420, as a function of frequency (f), may be represented by the following equation:

$$H(f) = -\frac{1}{2}e^{\frac{-j\omega T}{2}}\mathrm{sinc}\left(\frac{fT}{4}\right)\sin\left(\frac{\pi fT}{4}\right)\sin\left(\frac{\pi fT}{2}\right)$$

where T is sampling interval (1/fs) and ω (2πf) is the angular frequency.

Figure 8:
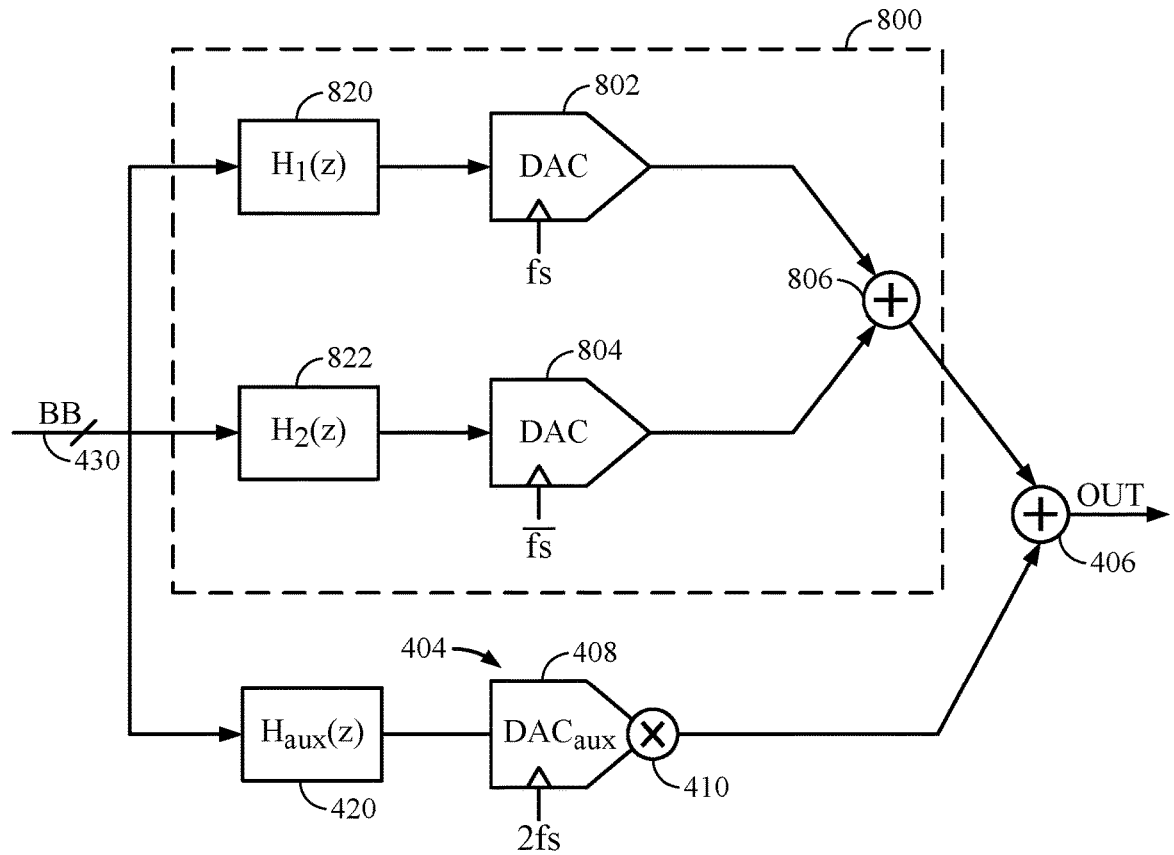
FIG. 8 illustrates the digital-to-analog conversion system of FIG. 4 implemented with an interleaved DAC circuit, in accordance with certain aspects of the present disclosure.

FIG. 8 illustrates the digital-to-analog conversion system 400 implemented with an interleaved DAC circuit 800, in accordance with certain aspects of the present disclosure. For example, the interleaved DAC circuit 800 may correspond to the DAC 402, described with respect to FIG. 4.

As illustrated, the interleaved DAC circuit 800 includes a DAC 802 and a DAC 804. In certain aspects, a filter 820 may be coupled between the input node 430 and the DAC 802, and a filter 822 may be coupled between the input node 430 and the DAC 804, as illustrated. The outputs of the DAC 802 and the DAC 804 are coupled to inputs of a combiner 806. The DAC 802 may sample a digital input signal based on a clock signal having a frequency fs, and the DAC 804 may sample a digital input signal based on another clock signal $\overline{\mathrm{fs}}$, having the same frequency fs, but inverted from the clock signal going to the DAC 802. In other words, the sampling clock signal provided to the DAC 804 is 180° out of phase with the sampling clock signal provided to the DAC 802. Thus, the image signals generated by the DAC 802 and the DAC 804 are cancelled when the output signals of DAC 802 and DAC 804 are combined. The image signal at the frequency 2fs is then cancelled by combining the output signal of the combiner 806 with the output signal generated by the mixing-mode DAC 404 via the combiner 406, as previously described with respect to FIG. 4. Since the image signal at 2fs has a relatively low magnitude (e.g., as compared to the image signal at fs), the mixing-mode DAC may be implemented to have an output power that is less than (e.g., by a factor of 4) than the DACs 802, 804.

Figure 9:
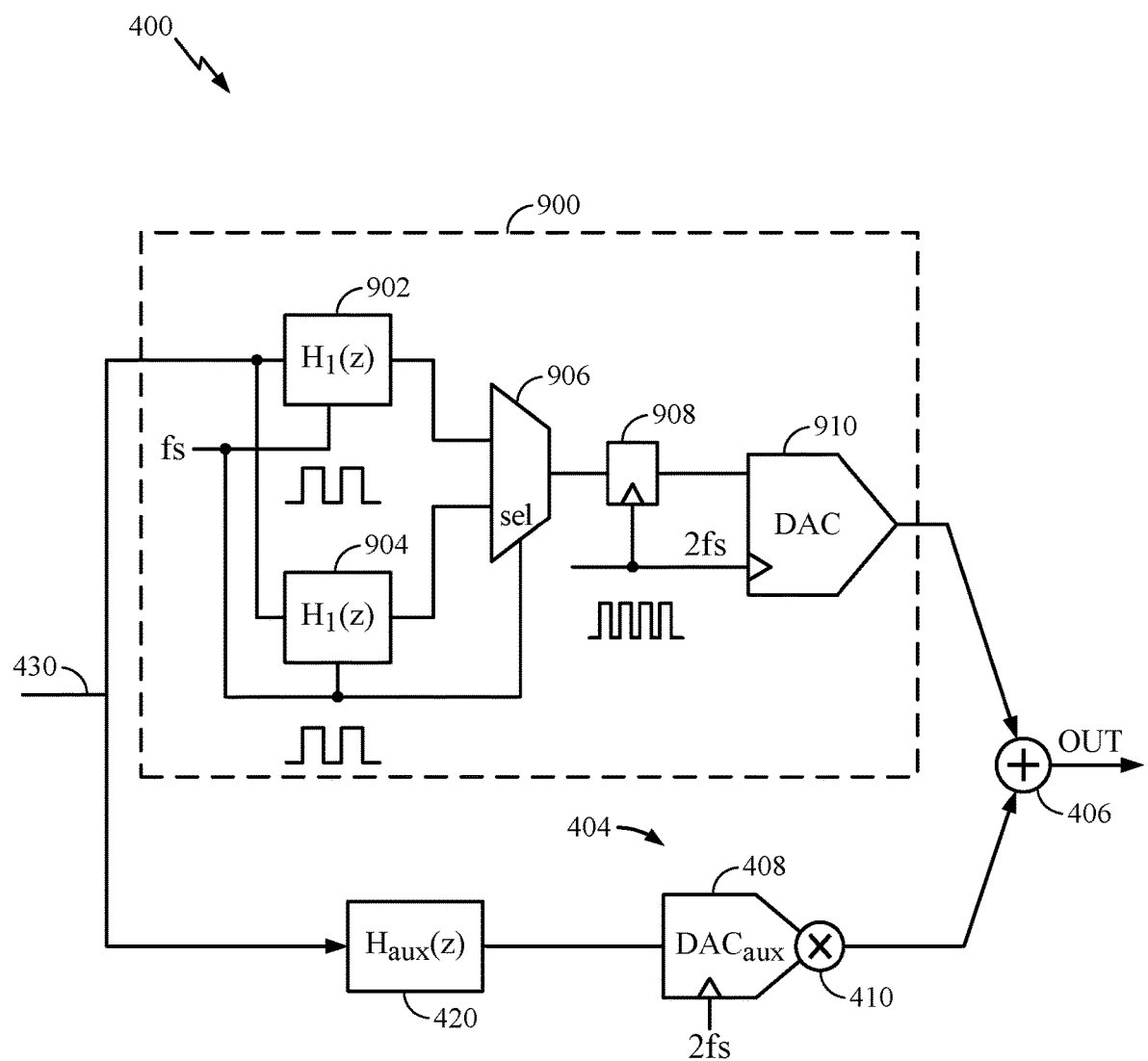
FIG. 9 illustrates the digital-to-analog conversion system of FIG. 4 implemented with an interpolated DAC circuit, in accordance with certain aspects of the present disclosure.

FIG. 9 illustrates the digital-to-analog conversion system 400 implemented with an interpolated DAC circuit 900, in accordance with certain aspects of the present disclosure. For example, the interpolated DAC circuit 900 may correspond to the DAC 402, described with respect to FIG. 4. The interpolated DAC circuit 900 includes a digital filter 902 and a digital filter 904, each configured to filter a digital input signal at the input node 430 based on a sampling clock signal having a frequency fs. The outputs of the digital filter 902 and the digital filter 904 are coupled to inputs of a multiplexer 906. The multiplexer 906 selects one of the signals generated by the digital filter 902 and the digital filter 904 based on the sampling clock signal having the frequency fs. For example, when the clock signal is logic high, the signal at the output of the multiplexer 906 may correspond to the signal at the output of the digital filter 902, and when the clock signal is logic low, the signal at the output of the multiplexer 906 may correspond to the signal at the output of the digital filter 904.

In certain aspects, the interpolated DAC circuit 900 may also include a synchronization circuit 908 to synchronize the signal at the output of the multiplexer 906 with another sampling clock signal having a frequency that is twice the frequency fs (2fs). The synchronized digital signal generated at the output of the synchronization circuit 908 is converted to an analog signal by a DAC 910. In certain aspects, the sampling frequency of the DAC 910 may be twice the frequency fs (2fs), as illustrated.

Figure 10:
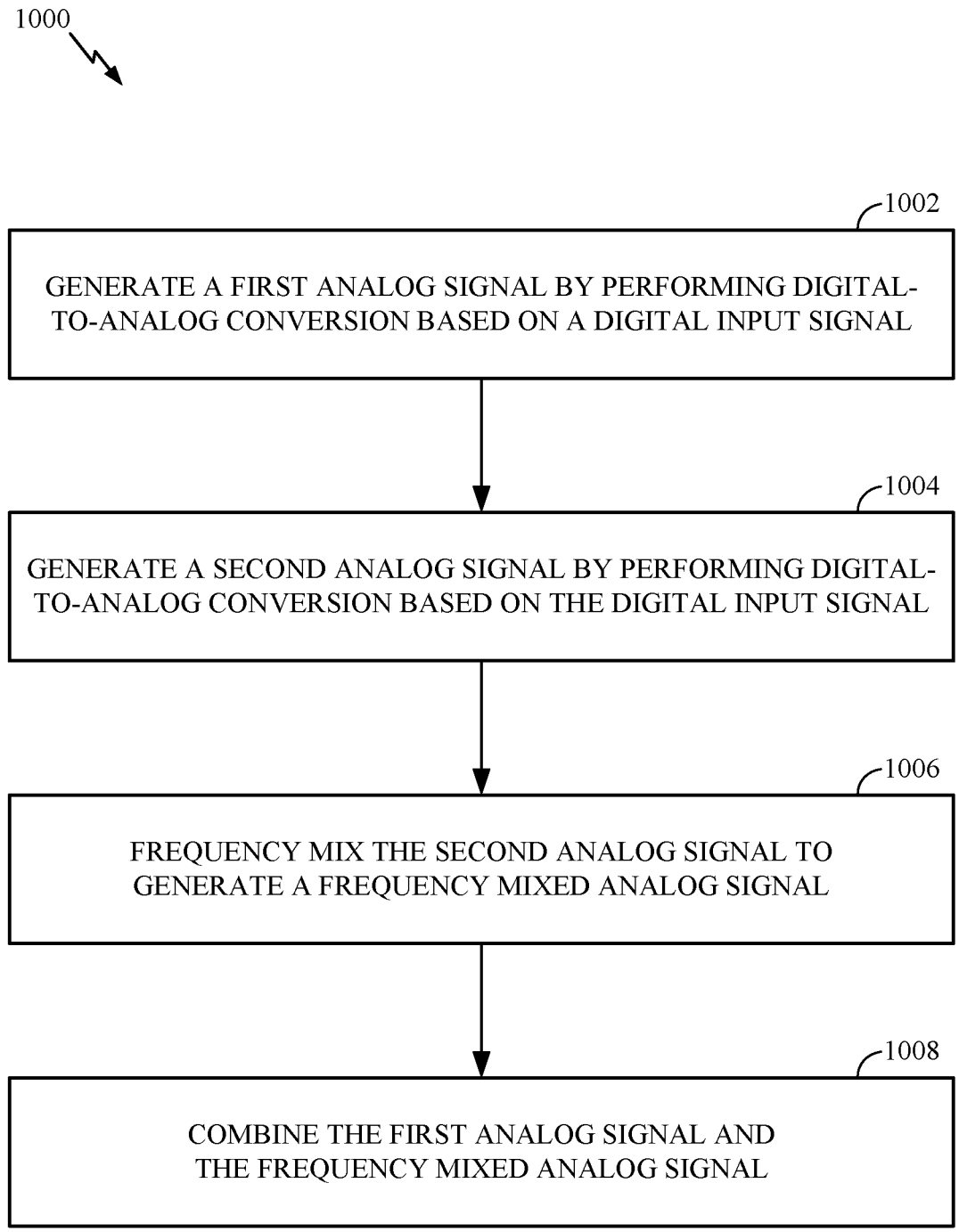
FIG. 10 is a flow diagram illustrating example operations for digital-to-analog conversion, in accordance with certain aspects of the present disclosure.

FIG. 10 is a flow diagram illustrating example operations 1000 for digital-to-analog conversion, in accordance with certain aspects of the present disclosure. The operations 1100 may be performed, for example, by a DAC system such as the digital-to-analog conversion system 400.

The operations 1000 begin, at block 1002, by generating a first analog signal by performing digital-to-analog conversion (e.g., via DAC 402) based on a digital input signal (e.g., digital input signal at input node 430), and at block 1004, generating a second analog signal by performing digital-to-analog conversion (e.g., via DAC 308) based on the digital input signal. At block 1006, the DAC system frequency mixes (e.g., via mixer 410) the second analog signal to generate a frequency-mixed analog signal, and at block 1008, combines (e.g., via combiner 406) the first analog signal and the frequency-mixed analog signal.

In certain aspects, generating the first analog signal, at block 1002, comprises performing digital-to-analog conversion based on a first sampling frequency. In certain aspects, generating the second analog signal, at block 1004, comprises performing digital-to-analog conversion based on a second sampling frequency. In certain aspects, the second sampling frequency may be greater than the first sampling frequency by a factor of n, n being an integer greater than 1.

In certain aspects, the operations 1000 also include filtering (e.g., via filter 420) the digital input signal to generate a filtered digital input signal, wherein the second analog signal is generated by performing digital-to-analog conversion based on the filtered digital input signal. In certain aspects, the filtering of the digital input signal to generate the filtered digital input signal comprises high-pass filtering the digital input signal.

In certain aspects, generating the first analog signal includes generating a third analog signal (e.g., via the DAC 802) by performing digital-to-analog conversion based on the digital input signal, generating a fourth analog signal (e.g., via the DAC 804) by performing digital-to-analog conversion based on the digital input signal, and combining (e.g., via the combiner 806) the third analog signal and the fourth analog signal to generate the first analog signal.

In certain aspects, generating the first analog signal also includes filtering (e.g., via filter 820) the digital input signal to generate a first filtered digital input signal. The third analog signal may be generated by performing digital-to-analog conversion based on the first filtered digital input signal. Generating the first analog signal may also include filtering (e.g., via filter 822) the digital input signal to generate a second filtered digital input signal. The fourth analog signal may be generated by performing digital-to-analog conversion based on the second filtered digital input signal.

In certain aspects, generating the first analog signal may include filtering (e.g., via digital filter 902) the digital input signal to generate a first filtered digital input signal, and filtering (e.g., via digital filter 904) the digital input signal to generate a second filtered digital input signal. Generating the first analog signal may also include selecting (e.g., multiplexer 906) one of the first filtered digital input signal or the second filtered digital input signal based on a clock signal, and performing digital-to-analog conversion (e.g., via DAC 910) based on the one of the first filtered digital input signal or the second filtered digital input signal to generate the first analog signal. In certain aspects, the filtering of the digital input signal to generate the first filtered digital input signal and the filtering of the digital input signal to generate the second filtered digital input signal are performed based on the clock signal, the clock signal having a first frequency. In this case, performing the digital-to-analog conversion based on the one of the first filtered digital input signal or the second filtered digital input signal to generate the first analog signal comprises sampling the one of the first filtered digital input signal or the second filtered digital input signal at a second frequency, the second frequency being double the first frequency. In certain aspects, generating the first analog signal also includes synchronizing (e.g., via synchronization circuit 908) the one of the first filtered digital input signal or the second filtered digital input signal with another clock signal having the second frequency.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for generating may include a DAC, such as the DAC 402 or DAC 408. In certain aspects, means for frequency mixing may include a mixer, such as the mixer 410. In certain aspects, means for combining may include a combiner, such as the combiner 406. In certain aspects, means for filtering may include a filter, such as the filter 420.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A system for digital-to-analog conversion, comprising:
   a first digital-to-analog converter (DAC) having an input coupled to an input node of the system, the first DAC being configured to perform digital-to-analog conversion of an input signal at the input node based on a first sampling frequency;
   a mixing-mode DAC having an input coupled to the input node of the system, the mixing-mode DAC comprising:
      a second DAC configured to perform digital-to-analog conversion of the input signal based on a second sampling frequency, wherein the second sampling frequency is a multiple of the first sampling frequency by a factor of n, n being an integer greater than 1; and
      a mixer, an output of the second DAC being coupled to an input of the mixer; and
   a combiner, wherein an output of the first DAC is coupled to a first input of the combiner, and wherein an output of the mixer is coupled to a second input of the combiner.

2. The system of claim 1, further comprising:
   a filter coupled between the input node of the system and the input of the mixing-mode DAC.

3. The system of claim 1, wherein the first DAC comprises an interleaved DAC circuit.

4. The system of claim 3, wherein the interleaved DAC circuit comprises:
   a third DAC having an input coupled to the input node of the system;
   a fourth DAC having an input coupled to the input node of the system; and
   another combiner, wherein an output of the third DAC is coupled to a first input of the other combiner, wherein an output of the fourth DAC is coupled to a second input of the other combiner, and wherein an output of the other combiner is coupled to the first input of the combiner.

5. The system of claim 4, wherein the interleaved DAC circuit further comprises:
   a first filter coupled between the input node of the system and the input of the third DAC; and
   a second filter coupled between the input node of the system and the input of the fourth DAC.

6. The system of claim 1, wherein the first DAC comprises an interpolated DAC circuit.

7. The system of claim 6, wherein the interpolated DAC circuit comprises:
   a first digital filter having an input coupled to the input node of the system;
   a second digital filter having an input coupled to the input node of the system;
   a multiplexer having a first input coupled to an output of the first digital filter and a second input coupled to an output of the second digital filter; and
   a third DAC having an input coupled to an output of the multiplexer and having an output coupled to the first input of the combiner.

8. The system of claim 7, wherein:
   the first digital filter and the second digital filter are configured to filter a digital signal at the input node based on a clock signal having a first frequency; and
   the third DAC is configured to sample a digital signal at the input of the third DAC at a second frequency, the second frequency being double the first frequency.

9. The system of claim 7, further comprising:
   a synchronization circuit coupled between the output of the multiplexer and the input of the third DAC.

10. A method for digital-to-analog conversion, comprising:
    generating a first analog signal by performing digital-to-analog conversion on a digital input signal based on a first sampling frequency;
    generating a second analog signal by performing digital-to-analog conversion on the digital input signal based on a second sampling frequency, wherein the second sampling frequency is a multiple of the first sampling frequency by a factor of n, n being an integer greater than 1;
    frequency mixing the second analog signal to generate a frequency-mixed analog signal; and
    combining the first analog signal and the frequency-mixed analog signal.

11. The method of claim 10, further comprising:
    filtering the digital input signal to generate a filtered digital input signal, wherein the second analog signal is generated by performing digital-to-analog conversion based on the filtered digital input signal.

12. The method of claim 11, wherein the filtering of the digital input signal to generate the filtered digital input signal comprises high-pass filtering the digital input signal.

13. The method of claim 10, wherein generating the first analog signal comprises:
    generating a third analog signal by performing digital-to-analog conversion based on the digital input signal;
    generating a fourth analog signal by performing digital-to-analog conversion based on the digital input signal; and
    combining the third analog signal and the fourth analog signal to generate the first analog signal.

14. The method of claim 13, wherein generating the first analog signal further comprises:

filtering the digital input signal to generate a first filtered digital input signal, wherein the third analog signal is generated by performing digital-to-analog conversion based on the first filtered digital input signal; and filtering the digital input signal to generate a second filtered digital input signal, wherein the fourth analog signal is generated by performing digital-to-analog conversion based on the second filtered digital input signal.

15. The method of claim 10, wherein generating the first analog signal comprises:

filtering the digital input signal to generate a first filtered digital input signal;

filtering the digital input signal to generate a second filtered digital input signal;

selecting one of the first filtered digital input signal or the second filtered digital input signal based on a clock signal; and performing digital-to-analog conversion based on the selected one of the first filtered digital input signal or the second filtered digital input signal to generate the first analog signal.

16. The method of claim 15, wherein:

the filtering of the digital input signal to generate the first filtered digital input signal and the filtering of the digital input signal to generate the second filtered digital input signal are performed based on the clock signal, the clock signal having a first frequency; and performing the digital-to-analog conversion based on the selected one of the first filtered digital input signal or the second filtered digital input signal to generate the first analog signal comprises sampling the selected one of the first filtered digital input signal or the second filtered digital input signal at a second frequency, the second frequency being double the first frequency.

17. The method of claim 16, further comprising:

synchronizing the selected one of the first filtered digital input signal or the second filtered digital input signal with another clock signal having the second frequency.

18. An apparatus for digital-to-analog conversion, comprising:

means for generating a first analog signal by performing digital-to-analog conversion on a digital input signal based on a first sampling frequency;

means for generating a second analog signal by performing digital-to-analog conversion on the digital input signal based on a second sampling frequency, wherein the second sampling frequency is a multiple of the first sampling frequency by a factor of n, n being an integer greater than 1;

means for frequency mixing the second analog signal to generate a frequency-mixed analog signal; and means for combining the first analog signal and the frequency-mixed analog signal.

19. The apparatus of claim 18, further comprising:

means for filtering the digital input signal to generate a filtered digital input signal, wherein the means for generating the second analog signal comprises means for performing digital-to-analog conversion based on the filtered digital input signal.

\* \* \* \* \*